United States Patent
Swedo

(10) Patent No.: US 7,319,130 B2
(45) Date of Patent: *Jan. 15, 2008

(54) PHENOLIC RESINS

(75) Inventor: Raymond J. Swedo, Mt. Prospect, IL (US)

(73) Assignee: Angus Chemical Company, Buffalo Grove, IL (US)

( * ) Notice: Subject to any disclaimer, the term of this patent is extended or adjusted under 35 U.S.C. 154(b) by 387 days.

This patent is subject to a terminal disclaimer.

(21) Appl. No.: 10/533,854

(22) PCT Filed: Nov. 19, 2003

(86) PCT No.: PCT/US03/36921

§ 371 (c)(1),
(2), (4) Date: May 4, 2005

(87) PCT Pub. No.: WO2004/050733

PCT Pub. Date: Jun. 17, 2004

(65) Prior Publication Data

US 2007/0055041 A1   Mar. 8, 2007

Related U.S. Application Data

(60) Provisional application No. 60/431,142, filed on Dec. 4, 2002.

(51) Int. Cl.
  C08G 8/10    (2006.01)
  C08G 14/04   (2006.01)
  C08G 14/06   (2006.01)
  C08F 283/00  (2006.01)

(52) U.S. Cl. ............... 528/129; 528/145; 525/534; 524/540; 524/541; 548/517

(58) Field of Classification Search ............... 528/129, 528/145; 525/534; 524/540, 541; 548/517
See application file for complete search history.

(56) References Cited

U.S. PATENT DOCUMENTS

| 2,363,466 A | 11/1944 | Senkus |
| 2,415,046 A | 1/1947 | Senkus |
| 3,305,413 A | 2/1967 | Flynn |
| 4,250,267 A | 2/1981 | Hartdegen |
| 5,684,114 A | 11/1997 | Phillips |
| 2001/0041782 A1 | 11/2001 | Okuhira |
| 2002/0183461 A1 | 12/2002 | Okuhira |
| 2005/0009980 A1 | 1/2005 | Swedo |
| 2005/0054787 A1 | 3/2005 | Swedo et al. |

FOREIGN PATENT DOCUMENTS

| EP | 0705856 | 4/1996 |
| EP | 0666296 | 6/1999 |
| WO | WO 97/18251 | 5/1997 |

OTHER PUBLICATIONS

Raymond J. Swedo, U.S. Appl. No. 10/830,808, Novel Phenolic Resins, filed Apr. 23, 2004.
Raymond J. Swedo, et al., PCT/US2004/024470, Novel Phenolic Resins, filed Jul. 28, 2004.
Raymond J. Swedo, PCT/US2004/024471, Phenolic Resin Systems for Fiber Reinforced Composite Manufacture, filed Jul. 28, 2004.
Derwent Abstract AN 1979-53365B for JP 54071120.

Primary Examiner—Duc Truong

(57) ABSTRACT

The invention herein disclosed comprises the use of oxazolidines, nitroalcohols, nitroamines, aminonitroalcohols, imines, hexahydropyimidines, nitrones, hydroxylamines, nitroolefins and nitroacetals to serve as hardeners and/or as catalysts for curing phenolic resins. The hardeners and catalysts described in the invention can be applied in any application where phenolic resins are used, including but not limited to adhesives, molding, coatings, pultrusion, prepregs, electronics, composites, fire resistant, and flame-retardant end uses.

28 Claims, No Drawings

PHENOLIC RESINS

CROSS REFERENCE TO RELATED APPLICATIONS

This application is a 371 of PCT/US2003/36921 filed Nov. 19, 2003, which claims the benefit of U.S. Provisional Application Ser. No. 60/431,142, filed Dec. 4, 2002, and U.S. patent application Ser. No. 10/383,272, filed Mar. 7, 2003, now abandoned.

The invention is directed toward compositions which are useful as hardeners and/or catalysts for novolac and resole phenolic resins.

Phenolic resins can be broadly divided into two general classes: novolacs and resoles. Novolac resins are generally characterized as being formaldehyde deficient. That is to say that the ratio of formaldehyde to phenolic groups is <1. Resole resins are generally characterized as being formaldehyde rich. That is to say that the ratio of formaldehyde to phenolic groups is >1. Both novolacs and resoles may incorporate a variety of phenolic compounds, alone or in combination, including but not limited to phenol, resorcinol, bisphenols, phloroglucinol, cresols, alkyl phenols, phenol ethers, tannins, and lignins. Similarly, other aldehydes may be substituted in whole or in part for formaldehyde, including but not limited to acetaldehyde, propionaldehyde, cyclohexanedicarboxaldehydes, benzaldehydes, furfural, and other aryl or heterocyclic aldehydes.

Novolac resins are usually cured (crosslinked, hardened) through the use of formaldehyde, formaldehyde-donating hardener compounds, or formaldehyde equivalent compounds. Hexamethylenetetramine (hexa) and paraformaldehyde are often used commercially to cure novolac resins. In addition to a source of formaldehyde, heating and the presence of a catalyst are usually employed to accelerate the rate and extent of curing. Catalysts may include inorganic bases such as sodium or potassium hydroxide, Lewis acids such as zinc chloride, or amines such as triethylamine.

Resoles, being formaldehyde rich, do not require additional formaldehyde to cure. Heat alone or heating in the presence of a catalyst—usually an acid—are all that are required.

The invention herein disclosed comprises the use of oxazolidines, nitroalcohols, nitroamines, imines, aminonitroalcohols, hexahyudropyrimidines, nitrones, hydroxylamines, nitro-olefins and nitroacetals to serve as hardeners and/or as catalysts for curing phenolic resins. These hardeners include both completely new compositions as well as known compounds found to have unexpected activity. The hardeners are effective in curing a wide range of phenolic resins, including novolacs and resoles. Through the judicious selection of these hardeners, used either alone or in various combinations, it is possible to advantageously vary the processing parameters of these phenolic resin systems. Lower curing temperatures, controlled curing rates, and reduced post-cure cycles are advantageous improvements as compared to standard hexa-cured novolac or acid-catalyzed resole systems. These process improvements and reduction in cycle time have obvious economic benefits.

The hardeners and catalysts described in this invention can be applied in any application where phenolic resins are used, including but not limited to adhesives, molding compounds, foundry materials, abrasives, friction materials, insulation, laminates, coatings, pultrusion, prepregs, electronics, composites, fire resistant, and flame-retardant end uses.

The invention includes novel curing agents, that is, hardeners and catalysts, drawn from a wide variety of existing and new oxazolidines, nitroalcohols, nitroacetals, nitroolefins, nitroamines, hexahydropyrimidines, aminonitroalcohols, nitrones, hydroxylamines, and imines, as described below. The hardeners and catalysts are selected from the group consisting of pyrrolidine/2-Methyl-2-nitro-1,3-propanediol (PYRR/NMPD), diethylamine/2-Methyl-2-nitro-1,3-propanediol (DEA/NMPD), 2-furfural/2-Methyl-2-nitro-1,3-propanol(FUR/NMP), vanillin-isopropylhydroxylamine (IPHA) nitrone, 2-Methyl-2-nitro-1,3-propanediol-bis-diethylamine (NMPD-bis-DEA), Cyclohexanedicarboxaldehyde diimine (CHDA-A), 2-dimethylamino-2-hydroxymethyl-1,3-propanediol (DMTA), dimethylamine-2-Methyl-2-nitro-1,3-propanediol (DMA-NMPD), bis-(2-nitroisobutoxy)methane (NMP acetal), 5-nitro-5-hydroxymethyl-1,3-bis(isopropyl)hexahydropyrimidine (PYRIM) and formaldehyde-based nitrones from hydroxylamine, including hydroxylamine (HA), N-isopropylhydroxylamine (IPHA), N-propylhydroxylamine (PHA), hydroxylamines N-ethylhydroxylamine (EHA), N-t-butylhydroxylamine (tBuHA), and N-benzyl hydroxylamine (N-BzHA).

EXAMPLES

Oxazolidines Zoldine® ZT-55 and ZT-65 (5-hydroxymethyl-1-aza-3,7-dioxabicyclo[3.3.0]octane), Bioban® CS-1246 (5-ethyl-1-aza-3,7-dioxabicyclo[3.3.0]octane), Bioban® CS-1135 (4,4-dimethyl-1-oxa-3-azacyclopentane), Amine CS-1991™ (5-methyl-1-aza-3,7-dioxabicyclo[3.3.0]octane), Zoldine® BBA (3-ethyl-2-isopropyl-1-oxa-3-azacyclopentane), and Bioban® N-95 (mixture of ZT, 5-hydroxymethoxymethyl-1-aza-3,7-dioxabicyclo[3.3.0]octane, and higher hydroxyalkoxymethyl oligomers), nitroalcohols tris(hydroxymethyl)-nitromethane (TN), 2-methyl-2-nitropropanol (NMP), and 2-methyl-2-nitro-1,3-propanediol (NMPD), and the hydroxylamines N-isopropylhydroxylamine (IPHA), N-ethylhydroxylamine (EHA), N-propylhydroxylamine (PHA), and N-t-butylhydroxylamine (tBuHA) were all obtained from Angus Chemical Company. The β-methyl-β-nitrostyrene, N,N-diethylhydroxylamine (DEHA), diethylamine (DEA), dimethylamine (DMA), isopropylamine (IPA), hexamethylenetetramine (HEXA), N-cyclohexylhydroxylamine (N-CyhexHA), N-benzylhydroxylamine (N-BzHA), hydroxylamine (HA), and common acids, bases, lab reagents and solvents were all commercial samples obtained from Aldrich Chemical Company. Formcel™ was obtained from Celanese. Durez PF novolac resin Varcum 29-607, Plenco PF novolac resin 13360, and Dynea PRF novolac resin 1204 were all commercially available materials. Other materials were synthesized as indicated below.

GC Analyses:

GC analyses were performed using a Hewlett Packard Model 5890A gas chromatograph with FID detector on a 30 meter×0.25 mm 1 µ film DB-5 column.

DSC Analyses:

DSC analyses were performed using a TA Instruments Model Q100 differential scanning calorimeter. The DSC scans were run from 25° C. to 400° C. at ΔT=10° C./minute with a nitrogen flow of 50 cc/minute. Samples were prepared by dissolving the resin and hardener components in excess ethanol, then removing the solvent under vacuum at room temperature. Non-hermetic, aluminum sample pans were used. A small hole was punctured in the top before crimping.

Gel Time Determinations:

The gel times of resin formulations were determined by the manual hot plate method.

A hot plate is preheated to 160° C. A small sample of the resin formulation is placed on the hot surface, and a timer is started. The sample melts and is "stroked" with a spatula until the gel point is reached, that is, the thickening melt no longer "threads" as the spatula is stroked through it. At this point the timer is stopped. The elapsed time is recorded as the gel time. Reported values are averages of multiple determinations.

Example 1

Synthesis of PYRR/NMPD

PYRR/NMPD: 2-Methyl-2-nitro-1,3-propanediol (NMPD; 27.02 g, 0.20 moles) and pyrrolidine (14.22 g, 0.20 moles) were charged to a 250 mL flask. The mixture was stirred at room temperature under a nitrogen blanket. After 30 minutes, an exotherm to 40° C. was observed, and the pale yellow solution became turbid. When the exotherm subsided, the reaction mixture was heated at 60° C. for 3 hours, then at 70° C. for 12 hours. The product mixture was diluted with an equal volume of ethanol and toluene, then the solvents were removed by rotary evaporation to azeotrope off the water. The yield of PYRR/NMPD as a clear, amber oil was 33.92 g. GC analysis indicated the presence of 13 area percent of unreacted NMPD.

Example 2

Synthesis of DEA/NMPD

DEA/NMPD: NMPD (13.52 g, 0.10 moles) and diethylamine (DEA; 10.34 mL, 7.31 g, 0.10 moles) were charged to a 100 mL flask. The mixture was stirred at room temperature to give a clear, yellow solution. The solution was stirred at room temperature under a nitrogen blanket for 6 days. The solution was then diluted with an equal volume of toluene, and the solvent was removed by rotary evaporation to azeotrope off the water. A yellow oil was isolated. Some white crystals of unreacted NMPD separated from the product on standing at room temperature. The NMPD was removed by filtration. The yield of DEA/NMPD as a clear, yellow oil was 12.45 g. GC analysis showed the oil contained <3 area percent of NMPD.

Example 3

Synthesis of FUR/NMP

FUR/NMP: Nitroethane (NE; 7.51 g, 0.10 moles), 2-furfural (19.22 g, 0.20 moles), and tetrahydrofuran (THF; 50 mL) were charged to a 250 mL flask. Amberlyst A-21 ion exchange resin (10 g) was then added. After stirring at room temperature under a nitrogen blanket for 2 weeks, the reaction mixture was filtered. The resin was washed on the filter with THF and the washings were combined with the filtrate. The solvent was removed by rotary evaporation to give 16.46 g of dark brown oil. GC/MS analysis indicated that the product was a mixture of ca. 14 area percent of unreacted 2-furfural, ca. 55 area percent of FUR/NMP product, and ca. 11 area percent of the nitro-olefin. The crude product mixture was purified by chromatography on a silica gel column (Merck, Grade 9385, 230-400 mesh). The column was eluted with methylene chloride to remove first the nitro-olefin, and then the purified FUR/NMP product. The yield of FUR/NMP as an amber oil was 11.26 g. GC analysis indicated that all of the nitro-olefin had been removed.

Example 4

Synthesis of Vanillin-IPHA Nitrone

Vanillin-IPHA Nitrone: Vanillin (30.43 g, 0.20 moles), isopropylhydroxylamine (IPHA; ANGUS lot 5-H-93; 15.02 g, 0.20 moles) and methanol (50 mL) were charged to a 500 mL flask. The mixture was stirred at room temperature under a nitrogen blanket to give a clear, yellow solution. After a few minutes, a slow exotherm began, with a temperature of ca. 45° C. being reached in 20 minutes. Shortly after the exotherm began to subside, crystalline solids began to separate from the reaction mixture. The reaction slurry was allowed to stir at room temperature overnight. The white crystalline solid product was isolated by filtration. The product was washed on the filter with a total of 100 mL of isopropanol. After drying, the yield of vanillin-IPHA nitrone product was 34.00 g. MP=178-179° C.

Example 5

Synthesis of NMPD-bis-DEA

NMPD-bis-DEA: NMPD (ANGUS lot ZD-06024; 27.08 g, 0.20 moles) and DEA (41.2 mL, 29.13 g, 0.40 moles) were dissolved with stirring in 40 g of distilled water in a 250 mL flask. An exotherm to 45° C. occurred over 10 minutes. The turbid reaction mixture solution was stirred at room temperature overnight. The reaction mixture was saturated with sodium chloride, then the layers were separated. The aqueous layer was extracted twice with equal volumes of ether. The extracts were combined and were dried over anhydrous magnesium sulfate. After filtering, the solvent was removed from the solution to give a quantitative yield of NMPD-bis-DEA as a clear yellow liquid product. GC analysis showed the product contained <3 area percent of NMPD.

Example 6

Synthesis of CHDA-bis-IPHA Nitrone

CHDA-bis-IPHA nitrone: Cyclohexanedicarboxaldehyde (CHDA; mixture of 1,4 and 1,3 isomers; Dow XUR-YM-2002108630; 14.02 g, 0.10 moles) and IPHA (ANGUS lot CEC200101840-54; 15.02 g, 0.20 moles) were stirred under nitrogen with 25 g of methanol in a 250 mL flask. An exotherm to ca. 50° C. ensued as the IPHA dissolved. The exotherm quickly cooled, resulting in a clear colorless solution. The solution was stirred at room temperature for several days. The solvent was removed from the solution by rotary evaporation. Toluene was added to the resulting paste, then the mixture was subjected to rotary evaporation again to remove water as an azeotrope. The resulting CHDA-bis-IPHA nitrone was an off-white solid. The yield was 23.3 g (92 percent). Because it was a mixture of isomers, the product exhibited a broad melting range of 130-140° C.

The product could be recrystallized from 10:1 toluene-isopropanol to give more discrete isomer fractions having narrower melting ranges.

Example 7

Synthesis of CHDA-A

CHDA-A: This adduct was made by the reaction of CHDA with an excess of aqueous ammonium hydroxide solution.

Example 8

Synthesis of DMTA

DMTA: This aminoalcohol was made by the reductive methylation of TN by a modification of the method described in U.S. Pat. No. 2,363,466.

Example 9

Synthesis of DMA-NMPD

DMA-NMPD: NMPD (ANGUS lot ZD-06024; 13.57 g, 0.10 moles) was dissolved in aqueous DMA (40 wt. percent, 12.6 mL, 4.53 g, 0.10 moles) with stirring at room temperature under nitrogen. Within 30 minutes the solution became very turbid and darker yellow in color. After 5 days at room temperature the reaction mixture was a white, waxy solid. The product was slurried with methanol and toluene, then the solvents were removed by rotary evaporation. The yield of off-white DMA-NMPD was 15.4 g (95 percent). MP was 73-77° C. GC analysis showed 4 area percent of NMPD.

Example 10

Synthesis of NMP Acetal

NMP acetal: This compound was prepared according to the method described in U.S. Pat. No. 2,415,046.

Example 11

Synthesis of PYRIM

PYRIM: TN (15 g, 0.1 moles), IPA (12 g, 0.2 moles), and 36 wt. percent aqueous formaldehyde (7 mL, 0.1 moles) were mixed in a flask. The mixture was cooled in an ice bath to avoid loss of the amine. It was then stirred at room temperature for 30 minutes, then it was kept at 5° C. overnight. The solid product that separated was isolated by filtration and dried in air for 4 hours. The yield of 5-nitro-5-hydroxymethyl-1,3-bis(isopropyl)hexahydropyrimidine (PYRIM) as a tan solid was 22 g (91 percent). MP=116-117° C.

Example 12

Synthesis of Formaldehyde-based Nitrones

FORMALDEHYDE-BASED NITRONES: Formaldehyde-based nitrones from hydroxylamine (HA), IPHA, PHA, EHA, tBuHA, and N-benzylHA were all prepared by the general procedure described below:

IPHA (7.51 g, 0.10 moles; ANGUS lot CEC200101840-54) was dissolved in 15 g of methanol, then Formcel™ (55 wt. percent formaldehyde in methanol; 5.45 g, 0.10 moles; Celanese lot T-2529 (1/11/01)) was added. The clear colorless solution was stirred at room temperature for a few minutes. GC analysis showed complete conversion to the nitrone. The resulting solution was 31 wt. percent in nitrone.

Example 13

Synthesis of PF Resole Resin

PF RESOLE RESIN RS20020437871: A resin kettle was charged with phenol (47 g, 0.5 moles), aqueous formaldehyde (37 wt. percent, 80 mL, 32.06 g, 1.0 mole) and 100 mL of 4 N sodium hydroxide solution. The solution was stirred under nitrogen. An exotherm to ca. 60° C. was observed upon mixing. This subsided over 1 hour. The reaction mixture was stirred at room temperature overnight. The reaction mixture was then heated at 90-95° C. for 1 hour. After cooling to room temperature, the mixture was brought to pH 7 with hydrochloric acid. During this neutralization the temperature of the reaction mixture was kept at ca. 15° C. by cooling the kettle in ice water. After neutralization, the reaction mixture was allowed to settle. The upper, aqueous layer was decanted from the lower, resole layer. The resole was diluted with ca. 400 mL of acetone, and the solution was dried over anhydrous magnesium sulfate. The dried solution was filtered, then the solvent was removed by rotary evaporation at room temperature. The yield of resole as a clear brown liquid was 39.0 g.

Example 14

Comparative DSC Data Survey

The objective of this work was to explore the potential for hardeners (methylene donors) and catalysts/accelerators to cure PF and PRF novolac resins. Hexamethylenetetramine (hexa) was used as the baseline for comparison since it is the hardener used most extensively in this industry.

Specific Examples of the Classes of Hardeners Cited in the Data

Oxazolidines (OX)

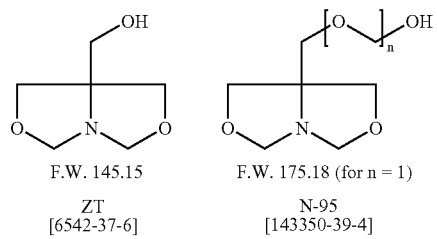

F.W. 145.15
ZT
[6542-37-6]

F.W. 175.18 (for n = 1)
N-95
[143350-39-4]

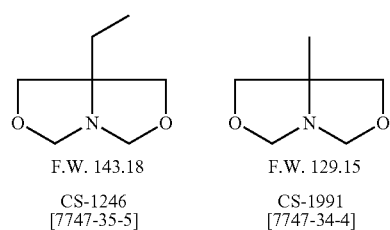

F.W. 143.18
CS-1246
[7747-35-5]

F.W. 129.15
CS-1991
[7747-34-4]

-continued

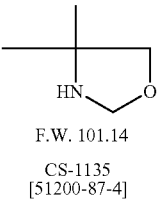
F.W. 101.14
CS-1135
[51200-87-4]

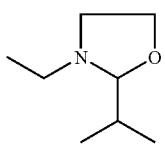
F.W. 143.22
ZOLDINE BBA
[127334-11-6]

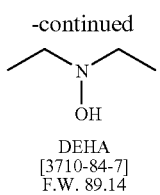
DEHA
[3710-84-7]
F.W. 89.14

Nitroolefins (NO) NITROACETALS (NAc)

Nitroalcohols (NA)

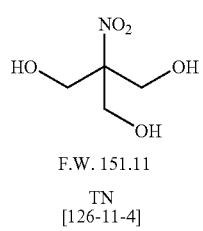
F.W. 151.11
TN
[126-11-4]

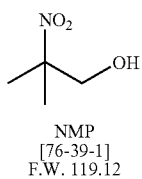
NMP
[76-39-1]
F.W. 119.12

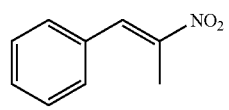
B-methyl-B-nitrostyrene
F.W. 163.17
[705-60-2]

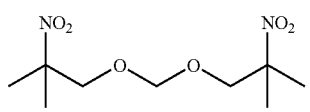
NMP acetal
F.W. 250.25
[6263-70-3]

Aminonitroalcohols (ANA)

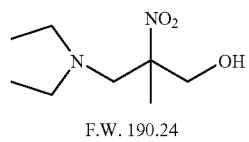
F.W. 190.24
DEA-NMPD
(new compound - no CAS#)

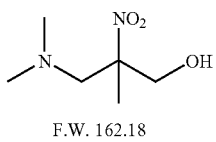
F.W. 162.18
DMA-NMPD
(new compound - no CAS#)

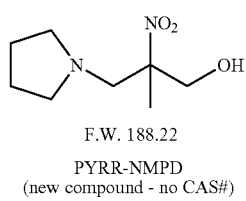
F.W. 188.22
PYRR-NMPD
(new compound - no CAS#)

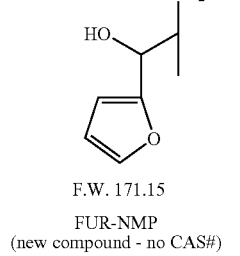
F.W. 171.15
FUR-NMP
(new compound - no CAS#)

Nitrones (NIT)

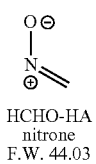
HCHO-HA
nitrone
F.W. 44.03

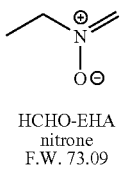
HCHO-EHA
nitrone
F.W. 73.09

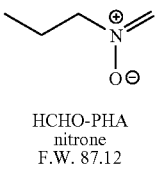
HCHO-PHA
nitrone
F.W. 87.12

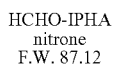
HCHO-IPHA
nitrone
F.W. 87.12

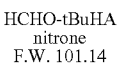
HCHO-tBuHA
nitrone
F.W. 101.14

Hydroxylamines (HA)

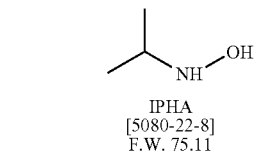
IPHA
[5080-22-8]
F.W. 75.11

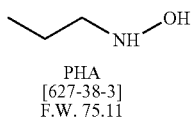
PHA
[627-38-3]
F.W. 75.11

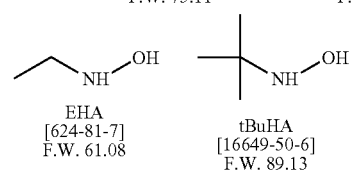
EHA
[624-81-7]
F.W. 61.08 tBuHA
[16649-50-6]
F.W. 89.13

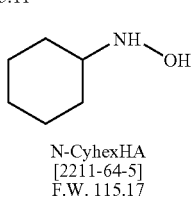
N-CyhexHA
[2211-64-5]
F.W. 115.17

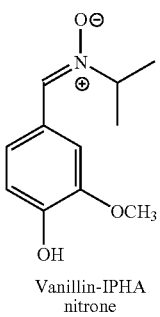
Vanillin-IPHA
nitrone
F.W. 209.24

-continued

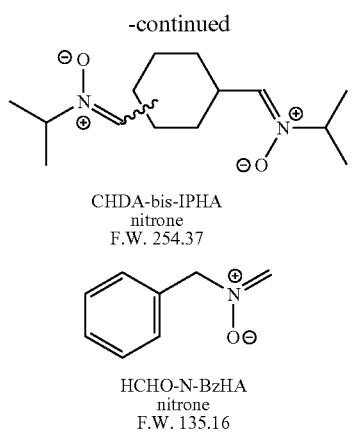

CHDA-bis-IPHA
nitrone
F.W. 254.37

HCHO-N-BzHA
nitrone
F.W. 135.16

Nitroamines (NAm) AMINES (Am)

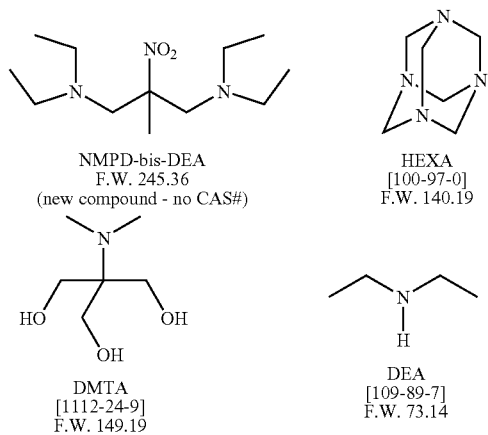

NMPD-bis-DEA
F.W. 245.36
(new compound - no CAS#)

HEXA
[100-97-0]
F.W. 140.19

DMTA
[1112-24-9]
F.W. 149.19

DEA
[109-89-7]
F.W. 73.14

Imines (Im)

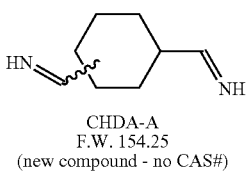

CHDA-A
F.W. 154.25
(new compound - no CAS#)

Hexahydropyrimidines (PYRIM)

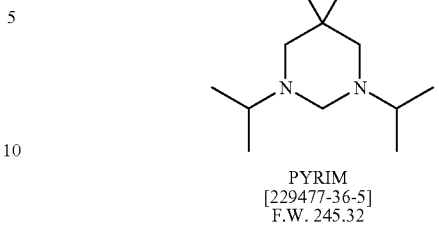

PYRIM
[229477-36-5]
F.W. 245.32

The data (see Table 1 below) showed that the behavior of both of the PF novolac resins evaluated (Durez 29-607 and Plenco 13360) gave essentially the same performance with the various hardeners/catalysts tested. This indicated that the variations in cure behavior were a function of the hardener/catalyst and not of the resin. It was therefore reasonable to expect that a given hardener or catalyst would give similar performance with any PF novolac.

The PRF resin (Dynea 1204) by virtue of its resorcinol content was more reactive than the PF novolac resins. This is a well-known property. The purpose for including it here was to determine the differences in performance between PF and PRF resins with these new hardeners/catalysts.

Overall, with PF novolacs, the oxazolidines (OX), nitroalcohols (NA), nitro acetals (NAc), nitrones (NIT) and the aminonitroalcohols (ANA) appear to act as methylene (formaldehyde) donors. The nitroolefins (NO) are incorporated, but not as effectively as the methylene donors.

The hydroxylamine IPHA is not capable of acting as a methylene donor. However, it exhibits catalytic activity when paired with other methylene donors such as TN and ZT, by lowering the curing onset and peak temperatures compared to the corresponding formulations without IPHA.

Paraformaldehyde is more typically used than hexa as a hardener in PRF novolac resin formulations. Hexa was used here, however, to better allow comparisons of the new hardeners/catalysts with the PF novolac resins.

Because of its resorcinol content, the PRF novolac resin generally exhibits higher reactivity than PF novolacs and its reactivity with OXs and ANAs in this study are different. For example, CS-1135 reacted vigorously and exothermally with the PRF novolac upon mixing at room temperature. TN and NMP acetal were more reactive with the PRF novolac than in the PF resins.

In contrast, the ANAs appeared to be much poorer methylene donors here. The 3° amine groups present in the ANAs appear to act as catalysts in the PF novolac formulations, but this catalytic activity is overshadowed by the higher reactivity already provided by the resorcinol groups.

TABLE 1

LOW TEMPERATURE CURING PHENOLIC RESINS
COMPARATIVE DSC DATA

| HARDENER (CLASS) | WT. % | RESIN | CURING EVENTS ONSET/PEAK C. (HEAT, J/g) | ONSET/PEAK C. (HEAT, J/g) | ONSET/PEAK C. (HEAT, J/g) | ONSET/PEAK C. (HEAT, J/g) |
|---|---|---|---|---|---|---|
| Hexa (Am-baseline) | 5.39 | Durez 29-607 PF novolac | 140/153 (69) | 218/227 (3) | 244/255 (72) | |
| | | Plenco 13360 PF novolac | 141/152 (122) | ca.200/228 (132) | | |
| | | Dynea 1204 PRF novolac | 104/122 (113) | 239/285 (18) | | |
| ZT-55 | 29.08 | Durez 29-607 PF novolac | 151/193 (137) | 286/316 (44) | | |

TABLE 1-continued

LOW TEMPERATURE CURING PHENOLIC RESINS
COMPARATIVE DSC DATA

| HARDENER (CLASS) | WT. % | RESIN | CURING EVENTS ONSET/PEAK C. (HEAT, J/g) | ONSET/PEAK C. (HEAT, J/g) | ONSET/PEAK C. (HEAT, J/g) | ONSET/PEAK C. (HEAT, J/g) |
|---|---|---|---|---|---|---|
| (OX) | | Plenco 13360 PF novolac | 150/191 (241) | 294/321 (54) | | |
| | | Dynea 1204 PRF novolac | ca.140/169 (98) | 272/299 (73) | | |
| CS-1246 | 14.13 | Durez 29-607 PF novolac | 142/183 (161) | 309/341 (30) | | |
| (OX) | | Plenco 13360 PF novolac | 143/181 (162) | 299/338 (48) | | |
| | | Dynea 1204 PRF novolac | 89/163 (114) | 305/327 (15) | | |
| CS-1135 | 22.29 | Durez 29-607 PF novolac | 65/98 (36) | 128/175 (68) | 304/351 (19) | |
| (OX) | | Plenco 13360 PF novolac | 60/115 (141) | ca.150/153 (110) | 267/321 (46) | |
| | | Dynea 1204 PRF novolac | (gels on mixing) | | | |
| CS-1991 | 15 | Durez 29-607 PF novolac | 100/118 (9) | 134/183 (129) | 295/336 (41) | |
| (OX) | | Plenco 13360 PF novolac | 90/187 (232) | 287/329 (65) | | |
| | | Dynea 1204 PRF novolac | 123/157 (73) | 305/323 (17) | | |
| DEA-NMPD | 25 | Durez 29-607 PF novolac | 97/113 (99) | 139/205 (124) | | |
| (ANA) | | Plenco 13360 PF novolac | 93/118 (39) | 150/167 (19) | 185/204 (48) | |
| | | Dynea 1204 PRF novolac | ca.110/173 (371) | | | |
| PYRR- | 25 | Durez 29-607 PF novolac | 100/112 (80) | 127/159 (80) | 161/181 (150) | 234/251 (134) |
| NMPD | | Plenco 13360 PF novolac | ca.100/130 (112) | 125/166 (478) | | |
| (ANA) | | Dynea 1204 PRF novolac | 130/172 (223) | ca.225/239 (149) | | |
| Vanillin-IPHA | 25 | Durez 29-607 PF novolac | 203/230 (143) | | | |
| (NIT) | | Plenco 13360 PF novolac | 200/232 (238) | | | |
| | | Dynea 1204 PRF novolac | 198/232 (209) | | | |
| TN/IPHA | 5.55/8.27 | Durez 29-607 PF novolac | 151/156 (179) | | | |
| (NA - HA) | | Plenco 13360 PF novolac | 142/153 (363) | | | |
| | | Dynea 1204 PRF novolac | 78/105 (209) | 163/193 (25) | ca.225/242 (46) | 302/346 (10) |
| ZT-55/IPHA | 14.54/8.27 | Durez 29-607 PF novolac | 136/167 (138) | 285/332 (34) | | |
| (OX - HA) | | Plenco 13360 PF novolac | 126/173 (139) | ca.200/210 (67) | 297/338 (66) | |
| | | Dynea 1204 PRF novolac | 77/104 (39) | 161/211 (90) | 286/304 (42) | |
| N-95 | 25 | Durez 29-607 PF novolac | 164/197 (145) | 297/329 (37) | | |
| (OX) | | Plenco 13360 PF novolac | 152/184 (163) | 293/325 (78) | | |
| | | Dynea 1204 PRF novolac | 80/170 (267) | ca.260/302 (75) | | |
| TN | 11.11 | Durez 29-607 PF novolac | 198/208 (254) | | | |
| (NA) | | Plenco 13360 PF novolac | 206/214 (421) | | | |
| | | Dynea 1204 PRF novolac | 83/107 (259) | 156/211 (51) | | |
| TN/ZT-55 | 5.55/14.54 | Durez 29-607 PF novolac | 172/191 (182) | | | |
| (OX - NA) | | Plenco 13360 PF novolac | 181/191 (424) | | | |
| | | Dynea 1204 PRF novolac | 103/164 (212) | 278/310 (32) | | |
| PYRR- | 15/15 | Durez 29-607 PF novolac | 79/114 (122) | ca.145/168 (276) | | |
| NMPD | | Plenco 13360 PF novolac | 80/131 (128) | ca.150/168 (454) | | |
| (ANA) | | Dynea 1204 PRF novolac | 107/174 (469) | ca.230/304 (220) | | |
| FUR-NMP | 25 | Durez 29-607 PF novolac | 208/251 (156) | | | |
| (ANA) | | Plenco 13360 PF novolac | 186/255 (227) | | | |
| | | Dynea 1204 PRF novolac | 90/117 (100) | ca.140/145 (87) | ca.230/241 (85) | |
| B-methyl-B- | 25 | Durez 29-607 PF novolac | 245/268 (60) | | | |
| nitrostyrene | | Plenco 13360 PF novolac | 241/276 (85) | | | |
| (NO) | | Dynea 1204 PRF novolac | ca.65/98 (305) | | | |
| NMP acetal | 25 | Durez 29-607 PF novolac | 123/163 (19) | 181/196 (48) | 266/290 (43) | |
| (NAc) | | Plenco 13360 PF novolac | 241/293 (102) | | | |
| | | Dynea 1204 PRF novolac | ca.200/272 (658) | | | |
| Zoldine BBA | 25 | Durez 29-607 PF novolac | 232/283 (46) | | | |
| (OX) | | Plenco 13360 PF novolac | 205/277 (189) | | | |
| | | Dynea 1204 PRF novolac | 72/112 (49) | 295/315 (23) | | |
| CS-1135/ | 15/8 | Durez 29-607 PF novolac | 134/155 (20) | 191/223 (39) | 279/345 (36) | |
| IPHA | | Plenco 13360 PF novolac | 83/108 (68) | 139/158 (68) | 281/331 (52) | |
| (OX - HA) | | Dynea 1204 PRF novolac | 70/110 (163) | ca.150/2121 (297) | | |
| N-95/IPHA | 15/8 | Durez 29-607 PF novolac | 137/159 (264) | 290/329 (49) | | |
| (OX - HA) | | Plenco 13360 PF novolac | 142/168 (171) | 293/339 (68) | | |
| | | Dynea 1204 PRF novolac | 69/105 (157) | ca.150/213 (265) | ca.280/304 (59) | |
| Vanillin-IPHA | 15/5 | Durez 29-607 PF novolac | 167/191 (81) | ca.200/232 (202) | | |
| nitrone/IPHA | | Plenco 13360 PF novolac | 171/190 (197) | ca.215/232 (184) | | |
| (NIT - HA) | | Dynea 1204 PRF novolac | 82/110 (288) | ca.170/238 (305) | | |
| CS-1246/ | 12.0/8.0 | Durez 29-607 PF novolac | 130/168 (301) | 268/330 (63) | | |
| IPHA | | Plenco 13360 PF novolac | 118/169 (308) | 276/325 (87) | | |
| (OX - HA) | | Dynea 1204 PRF novolac | 64/109 (157) | ca.160/213 (226) | ca.280/319 (33) | |
| CS-1991/ | 12.0/8.0 | Durez 29-607 PF novolac | 128/167 (332) | 266/329 (70) | | |
| IPHA | | Plenco 13360 PF novolac | 82/162 (259) | 260/333 (107) | | |
| (OX - HA) | | Dynea 1204 PRF novolac | 68/114 (114) | 122/182 (334) | ca.270/318 (43) | |
| ZT-55/TN/ | 10.0/5.0/ | Durez 29-607 PF novolac | ca.130/156 (353) | | | |
| (OX - NA) | | Plenco 13360 PF novolac | 129/157 (327) | ca.265/310 (161) | | |
| | | Dynea 1204 PRF novolac | ca.100/182 (293) | ca.255/305 (63) | | |

TABLE 1-continued

LOW TEMPERATURE CURING PHENOLIC RESINS
COMPARATIVE DSC DATA

| | | | CURING EVENTS | | | |
|---|---|---|---|---|---|---|
| HARDENER (CLASS) | WT. % | RESIN | ONSET/PEAK C. (HEAT, J/g) | ONSET/PEAK C. (HEAT, J/g) | ONSET/PEAK C. (HEAT, J/g) | ONSET/PEAK C. (HEAT, J/g) |
| B-methyl-B-Nitrostyrene/ TN (NO - NA) | 10.0/10.0 | Durez 29-607 PF novolac Plenco 13360 PF novolac Dynea 1204 PRF novolac | 210/217 (333) 203/213 (322) 76/104 (219) | ca.145/154 (259) | | |
| B-methyl-B-Nitrostyrene/ TN/IPHA (NO - NA - HA) | 10.0/5.0/5 | Durez 29-607 PF novolac Plenco 13360 PF novolac Dynea 1204 PRF novolac | 63/78 (21) 137/160 (246) 73/110 (321) | 147/175 (141) ca.205/ca.245 (196) ca.168/222 (216) | ca.200/229 (232) | |
| DEA-NMPD/ TN (ANA - NA) | 10.0/5.0 | Durez 29-607 PF novolac Plenco 13360 PF novolac Dynea 1204 PRF novolac | 125/177 (146) 92/103 (13) 62/80 (21) | 154/170 (5) 96/172 (417) | 211/232 (3) | 317/341 (5) |
| DEA-NMPD/ TN/IPHA (ANA - NA - HA) | 10.0/5.0/5 | Durez 29-607 PF novolac Plenco 13360 PF novolac Dynea 1204 PRF novolac | 73/90 (15) 75/93 (21) 71/156 (445) | 114/127 (84) 102/120 (55) ca.220/247 (148) | ca.205/222 (43) ca.175/216 (32) | |

TA Instruments Model Q100 DSC
Run Conditions: 10 C./minute from 25 C. to 400 C. with N2 at 50 cc/min
CLASS:
Am = amine
OX = oxazolidine
HA = hydroxylamine
ANA = aminonitroalcohol
NA = nitroalcohol
NAm = nitroamine
NO = nitroolefin
NAc = nitroacetal
NIT = nitrone
Im = imine
PYRIM = hexahydropyrimidine Example 15

Comparative DSC Data Survey

In order to demonstrate the utility of this invention, a series of formulations were prepared by dissolving a commercially available PF novolac resin (Varcum 29-607 available from Durez Corp.) in ethanol along with the hardener/catalyst system to be evaluated. The solvent was then removed in a vacuum oven at ambient temperature. The resulting solid resin formulation was evaluated using a differential scanning calorimeter (DSC; TA Instruments Model Q100) to observe curing onset and peak temperatures and heats of curing for the curing events taking place. The DSC scans were run at $\Delta T=10°$ C./minute from 25° C. to 400° C. Hexamethylenetetramine (hexa) was used as a baseline since it is the hardener most commonly used in the industry. The results of these DSC analyses are shown in the below Table 2.

The DSC results using hexa as the hardener show two exothermic curing events of nearly equal heat emission (measured as joules per gram, J/g). The ANGUS hardeners CS-1135 oxazolidine and the new nitroamninoalcohols DEA/NMPD and PYRR/NMPD showed dramatic lowering in the peak temperatures of both of the curing events. Significant cost savings may be realized through the use of lower mold temperatures allowed by using the hardeners of the invention. The combination of ZT-55 oxazolidine with new nitroaminoalcohol PYRR/NMPD resulted in almost all of the curing event taking place at <200° C. Advantageously, this provides cost savings through the elimination or dramatic reduction in the need for thermal post-curing. Oxazolidines ZT-55, CS-1991; and CS-1246, nitroalcohol TN, vanillin-IPHA nitrone, and the formulation of TN with ZT-55 all showed essentially all of the curing taking place in the 180-230° C. range. A further advantage indicated in these results is improved resin pot life at intermediate temperatures to allow for blending, resin transfer to molds, etc., followed by rapid cure at higher mold temperatures.

Unexpectedly, the HAs of the invention have been shown to have a catalytic/accelerator effect on other methylene donors. Further, the function and utility of nitrone (NIT) intermediates as curing agents was unexpected. The ability of HAs to improve upon the performance of hexa is a truly novel and significant breakthrough.

The question of use levels is somewhat complicated. Hexa is used as a hardener at levels of from 3 percent to as much as 15 or 20 percent based on resin weight. The use level depends upon the end use application, the cured resin properties desired in that application, and the processing conditions to be used.

Similarly, the ANGUS-based hardeners/methylene donors disclosed herein (OX, NA, NIT, ANA, NAm, NAc, PYRIM) can be used at different levels to achieve different processing behaviors and end use properties. As a guideline for use, we have assembled a table of "formaldehyde equivalents" for hexa and the various methylene donors we have disclosed. This table enables a user to determine how much of a chosen hardener is needed to provide the same equivalents of formaldehyde that would be provided by a given amount of hexa. In general, these new ANGUS-based hardeners would be expected to be used at from 0.1 wt. percent to as much as 75 wt. percent based on resin weight.

It should be noted that the objective of this invention was not only to discover new hardeners and catalysts that can be cured at lower temperatures than hexa-based formulation. In a broader sense, the objective was to discover new hardeners and catalysts that would lead to broader control over the processing of phenolic resins. Low temperature cure and/or a reduction in post cure baking time are certainly of value in terms of energy savings and increase in throughput. But an increase in pot life stability of a resin system can also provide significant benefits to an end user. Examples include injection molding, filament winding, and pultrusion applications in which the resin is often a melt rather than a solution. In these applications the ability to provide a resin formulation that will not advance while in the melt but will rapidly cure at an elevated cure temperature will result in more consistent parts, less resin waste, and less machine down-time to clean out advanced resin.

Finally, the hardeners and catalysts discovered in this invention can be used in any of the applications in which phenolic resins are used, including, molding compounds, foundry materials, abrasives, friction materials, insulation, adhesives, coatings, prepregs, electronics, laminates, filament winding, pultrusion, composites, and fire resistant and flame-retardant end uses.

TABLE 2

| | | RESIN SYSTEM | | | CURING EVENTS | | | |
|---|---|---|---|---|---|---|---|---|
| SUPPLIER | PRODUCT NUMBER | TYPE | HARDENER | WT. % | PEAK TEMP, C./ TOTAL HEAT, J/g | PEAK TEMP, C./ TOTAL HEAT, J/g | PEAK TEMP, C./ TOTAL HEAT, J/g | PEAK TEMP, C./ TOTAL HEAT, J/g |
| Durez | 29-607 | PF novolac | ZT-55/IPHA | 14.54/8.27 | 167/138 | | | 332/34 |
| | | | DEA/NMPD | 25 | 97/99 | 205/124 | | |
| | | | PYRR/NMPD | 25 | 112/ca 80 159/ca 80 | ca 181/ca 150 | ca 251/ca 45 | (tr @ 322) |
| | | | N-95 | 25 | | 197/145 | | 329/37 |
| | | | B-methyl-B-nitrostyrene | 25 | | | 268/ca 40 | ca 330/ca 20 |
| | | | NMP acetal | 25 | 163/19 | 196/48 | 290/34 | 327/9 |
| | | | Vanillin/IPHA nitrone | 25 | 103/11 139/15 | 230/143 | | 325/16 |
| | | | PYRR/NMPD/ ZT-55 | 15/15 | 114/122 168/122 | 192/108 | | 321/2 |

Example 15

Extensive Hardener/Catalyst Survey With Durez PF Novolac 29-607

A broader variety of hardeners/catalysts were evaluated alone and in combination. The results obtained in the comparative survey remain valid as shown in Table 3.

TABLE 3

LOW TEMPERATURE CURING PHENOLIC RESINS
Durez PF Novolac 29-607

| RESIN SYSTEM | | | CURING EVENTS | | | | GEL TIMES |
|---|---|---|---|---|---|---|---|
| HARDENER | WT. % | CLASS | ONSET/PEAK C. (HEAT, J/g) | ONSET/PEAK C. (HEAT, J/g) | ONSET/PEAK C. (HEAT, J/g) | ONSET/PEAK C. (HEAT, J/g) | SEC (MIN) 160 C. |
| HEXA | 5.39 | Am-baseline | 140/153 (69) | 218/227 (3) | 244/255 (72) | | 154 |
| ZT | 29.08 | OX | 151/193 (137) | 286/316 (44) | | | |
| CS-1246 | 14.13 | OX | 142/183 (161) | 309/341 (30) | | | 133 |
| CS-1135 | 22.29 | OX | 65/98 (36) | 128/175 (68) | 304/351 (19) | | 56 |
| CS-1991 | 15 | OX | 100/118 (9) | 134/183 (129) | 295/336 (41) | | 78 |
| Zoldine BBA | 25 | OX | 232/283 (46) | | | | |
| N-95 | 25 | OX | 164/197 (145) | 297/329 (37) | | | |
| TN | 11.11 | NA | 198/208 (254) | | | | |
| IPHA | 16.55 | HA | 147/159 (39) | 235/267 (65) | | | |
| DEA-NMPD | 25 | ANA | 97/113 (99) | 139/205 (124) | | | |
| | 15 | ANA | 88/108 (37) | ca.128/179 (62) | ca.205/222 (111) | | |
| DMA-NMPD | 25 | ANA | 111/211 (292) | | | | 39 |
| | 15 | ANA | 107/194 (265) | | | | |
| FUR-NMP | 25 | ANA | 208/251 (156) | | | | |
| PYRR-NMPD | 25 | ANA | 100/112 (80) | 127/159 (80) | 161/181 (150) | 234/251 (134) | 121 |
| NMPD-bis-DEA | 15 | NAm | 85/108 (76) | ca.160/185 (6) | ca. 190/239 (137) | | |

TABLE 3-continued

LOW TEMPERATURE CURING PHENOLIC RESINS
Durez PF Novolac 29-607

| | RESIN SYSTEM | | CURING EVENTS | | | | GEL TIMES |
|---|---|---|---|---|---|---|---|
| HARDENER | WT. % | CLASS | ONSET/PEAK C. (HEAT, J/g) | ONSET/PEAK C. (HEAT, J/g) | ONSET/PEAK C. (HEAT, J/g) | ONSET/PEAK C. (HEAT, J/g) | SEC (MIN) 160 C. |
| B-methyl-B-Nitrostyrene | 25 | NO | 245/268 (60) | | | | |
| NMP acetal | 25 | NAc | 123/163 (19) | 181/196 (48) | 266/290 (43) | | |
| Vanillin IPHA nitrone | 25 | NIT | 203/230 (143) | | | | (>60) |
| CHDA-bis-IPHA nitrone | 15 | NIT | 193/233 (209) | 321/342 (12) | | | |
| HCHO-IPHA nitrone | 15 | NIT | 181/215 (276) | | | | (41.75) |
| HCHO-PHA nitrone | 15 | NIT | 87/104 (9) | ca.150/173 (76) | ca.230/252 (50) | ca.300/342 (43) | |
| HCHO-tBuHA nitrone | 15 | NIT | 80/126 (21) | ca.140/162 (31) | 180/224 (260) | | |
| HCHO-EHA nitrone | 15 | NIT | ca.90/ca.125 (ca.10) | 146/172 (62) | ca.195/248 (151) | | |
| HCHO-HA nitrone | 15 | NIT | 102/159 (57) | 174/229 (238) | | | |
| HCHO-N-BzHA nitrone | 15 | NIT | ca.100/107 (100) | ca.115/164 (85) | ca.160/223 (304) | | (>30) |
| CHDA-A | 15 | NIT | 82/116 (27) | ca.140/154 (24) | 179/231 (124) | | 209 |
| Hexa/IPHA | 15 | Im | 88/107 (7) | ca.145/213 (144) | | | (31.25) |
| Hexa/IPHA | 6.0/6.0 | Am - HA | 128/178 (164) | ca.185/217 (262) | | | |
| Hexa/IPHA | 8.6/5.0 | Am - HA | 147/158 (56) | 198/228 (106) | | | 94 |
| Hexa/IPHA | 8.6/2.5 | Am - HA | 148/164 (33) | 215/230 (78) | | | 97 |
| Hexa/IPHA | 8.6/1.0 | Am - HA | 146/166 (17) | 196/220 (54) | | | 97 |
| Hexa/PHA | 6.0/6.0 | Am - HA | 93/112 (12) | 126/151 (27) | 149/208 (194) | | |
| Hexa/PHA | 8.6/5.0 | Am - HA | 153/164 (7) | 202/209 (10) | ca.215/230 (113) | | 143 |
| Hexa/PHA | 8.6/1.0 | Am - HA | 154/166 (13) | 199/208 (17) | ca.250/255 (108) | | 152 |
| Hexa/PHA | 8.6/0.5 | Am - HA | 151/167 (15) | 227/263 (68) | | | 140 |
| Hexa/PHA | 8.6/0.1 | Am - HA | 151/165 (15) | 224/283 (77) | | | 145 |
| Hexa/DEHA | 8.6/5.0 | Am - HA | 151/162 (17) | 192/215 (29) | | | 113 |
| Hexa/DEHA | 8.6/1.0 | Am - HA | 152/165 (16) | 223/252 (17) | | | 143 |
| Hexa/N-Cy-hex HA | 8.6/2.5 | Am - HA | 92/116 (24) | ca.145/162 (38) | ca.180/235 (82) | | |
| Hexa/NMPD bis-DEA | 8.6/2.0 | Am - NAm | 89/165 (48) | ca.205/218 (28) | | | 145 |
| CS-1135/IPHA | 15.0/8.0 | OX - HA | 134/155 (20) | 191/223 (39) | 279/345 (38) | | |
| CS-1246/IPHA | 10.0/5.0 | OX - HA | 71/107 (61) | ca.128/152 (50) | ca.160/182 (39) | ca.330/357 (29) | 83 |
| CS-1246/IPHA | 12.0/8.0 | OX - HA | 130/168 (301) | 268/330 (63) | | | |
| CS-1246/IPHA | 12.0/1.0 | OX - HA | 139/172 (133) | 313/343 (25) | | | 133 |
| CS-1246/DEHA | 12.0/1.0 | OX - HA | 145/173 (104) | 289/342 (42) | | | 105 |
| CS-1991/IPHA | 12.0/8.0 | OX - HA | 128/167 (332) | 266/329 (70) | | | |
| N-95/IPHA | 15.0/8.0 | OX - HA | 137/169 (264) | 290/329 (49) | | | |
| ZT/IPHA | 14.54/8.27 | OX - HA | 136/167 (138) | 285/332 (34) | | | |
| CS-1135/DMTA | 10.0/5.0 | OX - Am | 93/142 (87) | 226/289 (146) | | | |
| TN/IPHA | 5.55/8.27 | NA - HA | 151/156 (179) | | | | 303 |
| TN/IPHA | 14.4/2.0 | NA - HA | 189/203 (234) | | | | 170 |
| TN/IPHA | 12.8/5.0 | NA - HA | 151/156 (88) | ca.175/ca.180 (85) | | | 483 |
| TN/IPHA | 12.8/1.0 | NA - HA | 192/204 (283) | | | | (>7) |
| TN/IPHA | 12.8/0.5 | NA - HA | 198/209 (299) | | | | (>7) |
| TN/IPHA | 12.8/0.1 | NA - HA | 207/216 (243) | | | | |
| TN/PHA | 5.0/5.0 | NA - HA | 145/167 (237) | | | | (>7) |
| TN/PHA | 12.8/5.0 | NA - HA | 149/179 (323) | | | | (7.00) |
| TN/PHA | 12.8/1.0 | NA - HA | 188/206 (299) | | | | (>8) |
| TN/PHA | 12.8/0.5 | NA - HA | 196/206 (522) | | | | (14.25) |
| TN/PHA | 12.8/0.1 | NA - HA | 205/215 (244) | | | | 198 |
| TN/DEHA | 12.8/2.0 | NA - HA | 163/185 (222) | | | | 193 |
| TN/N-Cy-hex HA | 12.8/5.0 | NA - HA | 151/172 (293) | | | | |
| TN/ZT | 5.55/14.54 | NA - OX | 172/191 (182) | | | | |
| TN/DMTA | 10.0/5.0 | NA - Am | 105/119 (15) | 125/144 (178) | ca.245/283 (74) | | |
| NMP/DEA | 8.0/7.0 | NA - Am | 197/243 (184) | | | | |

TABLE 3-continued

LOW TEMPERATURE CURING PHENOLIC RESINS
Durez PF Novolac 29-607

| HARDENER | RESIN SYSTEM WT. % | CLASS | CURING EVENTS ONSET/PEAK C. (HEAT, J/g) | ONSET/PEAK C. (HEAT, J/g) | ONSET/PEAK C. (HEAT, J/g) | ONSET/PEAK C. (HEAT, J/g) | GEL TIMES SEC (MIN) 160 C. |
|---|---|---|---|---|---|---|---|
| TN/CHDA-A | 14.4/10.0 | NA - Im | 148/183 (241) | | | | 110 |
| | 14.4/5.0 | NA - Im | 103/196 (321) | | | | 105 |
| | 10.0/5.0 | NA - Im | 91/114 (14) | c34/168 (314) | | | |
| TN/NMPD-bis-DEA | 12.8/2.0 | NA - NAm | 157/184 (190) | | | | 85 |
| | 12.8/1.0 | NA - NAm | 158/164 (311) | | | | 110 |
| | 5.0/10.0 | NA - NAm | 81/105 (83) | ca.145/174 (111) | ca.220/243 (115) | | 42 |
| TN/B-methyl-B-Nitrostyrene | 10.0/10.0 | NA - NO | 210/217 (333) | | | | |
| Vanillin-IPHA nitrone/TN | 15.0/5.0 | NIT NA | 167/191 (81) | ca.200/232 (202) | | | |
| CHDA-bis-IPHA nitrone TN | 10.0/14.4 | NiT - NA | 172/183 (232) | | | | 260 |
| CHDA-bis-IPHA nitrone DEA-NMPD | 10.0/5.0 | NIT - ANA | 181/216 (114) | | | | |
| DEA-NMPD/TN | 10.0/5.0 | ANA - NA | 125/177 (146) | | | | 66 |
| DMA-NMPD/TN | 10.0/5.0 | ANA - NA | 112/125 (52) | ca.140/193 (233) | | | |
| DMA-NMPD/TN | 2.0/14.4 | ANA - NA | 169/191 (157) | | | | 238 |
| DEA-NMPD/IPHA | 10.0/5.0 | ANA - HA | 86/110 (48) | ca.125/138 (46) | ca.175/237 (125) | | |
| DEA-NMPD/PHA | 10.0/5.0 | ANA - HA | 95/111 (22) | 119/139 (53) | ca.170/217 (139) | | |
| PYRR-NMPD/ZT | 15.00/15.00 | ANA - OX | 79/114 (122) | ca.145/168 (276) | | | 91 |
| DEA-NMPD/CS-1135/IPHA | 10.0/10.0/5 | ANA-OX-HA | ca.105/119 (43) | ca.130/138 (33) | ca.175/204 (117) | | ca.240 |
| DEA-NMPD/TN/IPHA | 10.0/10.0/5 | ANA-NA-HA | 73/90 (15) | 114/127 (84) | ca.205/222 (43) | | 150 |
| DMA-NMPD/TN/IPHA | 10.0/5.0/5 | ANA-NA-HA | ca.100/108 (17) | 123/127 (53) | ca.160/165 (105) | | |
| | 9.0/10.0/1 | ANA-NA-HA | 91/106 (14) | 122/158 (84) | | | 43 |
| | 2.0/14.4/1 | ANA-NA-HA | 171/192 (243) | | | | 115 |
| TN/IPHA/DMA-NMPD | 2.0/12.8/1 | ANA-NA-HA | 181/201 (181) | | | | 130 |
| ZT/TN/IPHA | 10.0/5.0/5 | OX-NA-HA | ca.130/156 (353) | | | | 121 |
| | 5.0/12.8/2 | OX-NA-HA | 165/187 (187) | | | | 195 |
| CS-1246/TN IPHA | 7.0/7.0/1 | OX-NA-HA | 153/177 (149) | | | | 148 |
| B-methyl-B-nitrostyrene/TN/IPHA | 10.0/5.0/5 | NO-NA-HA | 63/78 (21) | 147/175 (141) | ca.200/229 (232) | | 291 |
| PYRIM/IPHA | 17.5/2.0 | PYRIM-HA | 118.130 (50) | ca.145/158 (184) | | | 58 |
| PYRIM/TN/IPHA | 4.6/12.8/2 | PYRIM-NA-HA | 106/122 (16) | 133/147 (217) | | | 78 |
| | 2.0/12.8/1 | PYRIM-NA-HA | 167/184 (234) | | | | 97 |

SUMMARY OF DSC DATA
TA Instruments Model Q 100 DSC
Run Conditions: 10 C./minute from 25 C. to 400 C. with N2 at 50 cc/min.
CLASS:
Am = amine
OX = oxazolidine
HA = hydroxylamine
ANA = aminonitroalcohol
NA = nitroalcohol
NAm = nitroamine
NO = nitroolefin
NAc = nitroacetal
NIT = nitrone
Im = imine
PYRIM = hexahydropyrimidine In addition, the following observations can be made:

Oxazolidines (OX)

The ability of an oxazolidine to act as a methylene donor is a function of its structure.

Oxazolidines derived from aldehydes other than formaldehyde show low activity (Zoldine BBA).

Bis-oxazolidines such as ZT and CS-1991 are poorer methylene donors than mono-oxazolidines such as CS-1135. They have a greater affinity for formaldehyde. It is expected that mono-oxazolidines in which the N—H was replaced by N—R would also be poorer methylene donors.

While N-95 has a higher formaldehyde equivalent weight than ZT, it has comparable reactivity. The additional formaldehyde content is not in a more active form.

CS-1135 and CS-1991 are more effective methylene donors than hexa by DSC, and CS-1135, CS-1991, and CS-1246 showed shorter gel times than a hexa formulation containing the same formaldehyde equivalent.

The combination of an oxazolidine (ZT) with a nitroalcohol (TN) did not improve performance. No synergy was realized.

The combination of oxazolidines with hydroxylamines (HA) seemed to result in a lowering in the temperature of the second curing event seen by DSC, but had little positive effect on the initial curing events. This behavior was corroborated by the lack of improvement in gel times. Both N-alkyl and N,N-dialkyl HAs showed similar performance.

The 3° amine DMTA showed DSC performance similar to HAs.

The combination of ANAs with OX improved both DSC performance and gel time, but used in combination with HAs were similar to HAs alone.

The combination of OXs with NAs and HAs showed improved DSC and gel time performance when OX was the predominant methylene donor.

Aminonitroalcohols (ANA)

The ANAs DEA-NMPD AND PYRR-NMPD had lower DSC cure onset and peak temperatures and shorter gel times than the hexa baseline formulation.

The combination of the ANA DEA-NMPD with the nitroalcohol (NA) TN had lower DSC cure onset and peak temperatures and shorter gel time than the hexa baseline formulation. Poorer results were obtained with DMA-NMPD.

The DSC performance of ANAs in the presence of HAs was better than with ANAs alone.

Formulations containing ANAs, NAs, and HAs had better DSC and gel time performance than ANA-NA or ANA-HA formulations.

Overall, ANAs appear to act as both catalysts by virtue of their Mannich base 3° amine group and as methylene donors through both their nitroalcohol group and their Mannich base group.

Nitroalcohols (NA)

NAs alone are weak methylene donors in PF novolac resin formulations.

The combination of NAs with HAs did show improved DSC and gel time performance although these formulations did not perform better than the hexa baseline formulation.

The combination of NAs with amines (Am) showed improved DSC performance with DMTA but not with DEA. It can be surmised that stronger base strength gives better performance.

The imine (Im) CHDA-A in combination with the NA TN gave better DSC performance and shorter gel times than the hexa baseline formulation.

Combinations of nitroamines (NAm) with NA gave DSC and gel time results that were similar to those obtained with ANAs and NAs. Performance was better than with the hexa baseline formulation.

Nitroamines (NAm)

The low DSC curing onset and peak temperatures observed with NMPD-bis-DEA confirmed the hypothesis that the Mannich base groups of both the ANAs and NAms act as both catalysts and as methylene donors. Performance was better than hexa baseline.

NMPD-bis-DEA is effective in generating low DSC cure temperatures and short gel times even at catalytic concentrations (1-2 percent).

Hexahydropyrimidines (PYRIM)

PYRIM are effective methylene donors.

Formulations of PYRIM with HAs gave better DSC and gel time performance than the hexa baseline formulation.

Formulations of PYRIM with HAs and NAs gave better DSC and gel time performance than the hexa baseline formulation.

Nitrones (NIT)

NIT derived from IPHA and CHDA or vanillin are methylene donors and are about as effective as NAs.

The performances of the IPHA nitrones of CHDA or vanillin are not improved by formulation with NAs or ANAs.

The formaldehyde nitrones of EHA, PHA, IPHA and tBuHA all gave better DSC performances than the hexa baseline formulation.

The DSC performances of the formaldehyde-IPHA and the formaldehyde-PHA nitrones were comparable to those of the TN-IPHA and TN-PHA formulation. This strongly supports the intermediacy of nitrones in NA-HA formulations.

Nitroolefins (NO)

NOs are incorporated at high reaction temperatures.

Formulation of NA with NO gives DSC performance comparable to the NA alone. No synergy was observed.

Formulations of NO with both NA and HA gave DSC and gel time results that were comparable to NA-HA formulations. No synergy was observed.

Nitroacetals (NAc)

The DSC performance of NAcs were comparable to those of NAs.

Hydroxylamines (HA)

The performance of this class of compounds is discussed in combination with the other classes. HA alone was not effective in curing PF novolac.

Imines (Im)

CHDA-A alone was comparable in performance to TN.

CHDA-A was effective in improving the DSC and gel time performance of NA formulations. Performance was better than hexa baseline.

Hexa-Based formulations (Am)

HAs were found to be effective methylene transfer agents even in hexa formulations. This is a completely novel and unexpected result, but it does fit the performance of HAs seen above.

IPHA in particular appears to perform catalytically with hexa. Formulations containing a fixed level of hexa with 5.0, 2.5, and 1.0 percent of IPHA all gave the same gel time.

PHA, DEHA, and N-CyhexHA were less effective than IPHA, but were still improved over the baseline hexa formulation.

Formulations of NAm with hexa were only marginally improved over the baseline hexa formulation.

Example 16

Hardener/Catalyst Study with PF Resole

PF resole resins are made with an excess of formaldehyde. Hence, they do not require a methylene donor to effect curing. Typically, they are cured by heat alone, or with heat and an acid catalyst.

The data shown above indicated that HAs were effective methylene transfer agents. Since resole resins are formaldehyde rich, it begged the question to determine whether HAs could effectively cure resole resins via similar methylene group transfer.

In order to evaluate the effects of the HAs alone, a resole resin was synthesized free of residual acid or base.

The results of this preliminary study (Table 4) showed the following:

IPHA increased the gel time of the resole resin. Gel time increased with increasing IPHA concentration.

OX increased the gel times of the resole resin. The less reactive ZT gave longer gel time than the more reactive CS-1135. This is probably a function of base strength.

TN gave a gel time intermediate between ZT and CS-1135. The addition of IPHA to TN actually increased gel time further.

Resole resin catalyzed with oxalic acid had a shorter gel time than the uncatalyzed resin.

The gel times for oxalic acid-IPHA formulations increased in gel time, with longer gel time at higher IPHA concentration.

However, this increased gel time behavior, although unexpected, may actually be of great benefit: it may be a means of effectively improving the working pot life of resole resin formulations without impairing their performance.

TABLE 4

LOW TEMPERATURE CURING PHENOLIC RESINS
PF RESOLE STUDIES - correlation of DSC data with Gel Time data

| HARDENER | WT. % | CLASS | DSC CURING EVENTS | | | | GEL TIMES SEC (MIN) 160 C. |
|---|---|---|---|---|---|---|---|
| | | | ONSET/PEAK TEMP, C./ (HEAT, J/g) | ONSET/PEAK TEMP, C./ (HEAT, J/g) | ONSET/PEAK TEMP, C./ (HEAT, J/g) | ONSET/PEAK TEMP, C./ (HEAT, J/g) | |
| None | None | (none) | 147/177 (195) | ca.200/235 (281) | | | 63 |
| IPHA | 1 | HA | ca.150/191 (224) | ca.215/228 (220) | | | 77 |
| | 5 | HA | 157/180 (155) | ca.205/237 (103) | | | 92 |
| | 10 | HA | 164/182 (192) | ca.215/236 (94) | ca.325/331 (18) | | 108 |
| ZT | 10 | OX | 165/191 (289) | ca.220/238 (168) | | | 127 |
| CS-1135 | 10 | OX | 117/134 (11) | 155/173 (111) | ca.205/236 (174) | ca.310/319 (34) | 85 |
| TN | 5 | NA | ca.150/185 (160) | ca.218/244 (233) | | | 108 |
| TN/IPHA | 5.0/1.0 | NA - HA | 154/192 (192) | ca.225/240 (170) | | | 119 |
| Oxalic acid | 1 | Acid | | | | | 48 |
| Oxalic acid/ | 1.0/1.0 | Acid/HA | | | | | 53 |
| IPHA | 1.0/10.0 | Acid/HA | | | | | 143 |

RESOLE: RS200204378-71
>>TA Instruments Model Q 100 DSC
Run Conditions: 10 C./minute from 25 C. to 400 C. with 50 cc/min. N2
>>Gel Times determined using the hot plate method
>>CLASS:
Am = amine
OX = oxazolidine
HA = hydroxylamine
ANA = aminonitroalcohol
NA = nitroalcohol
NAm = nitroamine
NO = nitroolefin
NAc = nitroacetal
NIT = nitrone
Im = imine
PYRIM = hexahydropyrimidine

| HARDENER | CHEMICAL FAMILY | PHYSICAL FORM | ACTIVES % W/W | MOLECULAR WEIGHT | MOLES HCHO AVAILABLE Per gram* | MOLES HCHO AVAILABLE Per pound* |
|---|---|---|---|---|---|---|
| Hexamethylenetetramine | Amine | Solid | 100 | 140.19 | 0.0428 | 19.41 |
| Formalin | Aldehyde | Liquid | 37 (Aq) | 30.03 | 0.0123 | 5.59 |
| TN | Nitroalcohol | Solid | 100 | 151.11 | 0.0199 | 9.01 |
| NMPD | " | " | " | 135.11 | 0.0148 | 6.73 |
| NMP | " | " | " | 119.12 | 0.0084 | 3.81 |
| ZT-100 | Oxazolidine | " | " | 145.15 | 0.0138 | 6.26 |
| ZT-55 | " | Liquid | 55 (Aq) | 145.15 | 0.0076 | 3.44 |
| CS-1246 | " | " | 100 | 143.18 | 0.0140 | 6.35 |
| CS-1991 | " | " | " | 129.15 | 0.0155 | 7.04 |
| CS-1135 | " | " | 78 (Aq) | 101.14 | 0.0077 | 4.49 |
| DMA - NMPD | Aminonitroalcohol | Solid | 100 | 162.18 | 0.0123 | 5.60 |
| DEA - NMPD | " | Liquid | " | 190.24 | 0.0105 | 4.76 |
| PYRR - NMPD | " | " | " | 188.22 | 0.0106 | 4.82 |
| NMPD-bis-DEA | Nitroamine | " | " | 245.36 | 0.0082 | 3.70 |
| HCHO - EHA | Nitrone | " | 34 (MeOH) | 73.09 | 0.0047 | 2.11 |
| HCHO - PHA | " | " | 31 (MeOH) | 87.12 | 0.0036 | 1.61 |
| HCHO - IPHA | " | " | 31 (MeOH) | 87.12 | 0.0036 | 1.61 |
| HCHO - tBuHA | " | " | 30 (MeOH) | 101.14 | 0.0030 | 1.35 |
| Vanillin - IPHA nitrone | " | Solid | 100 | 209.24 | 0.0048 | 2.17 |
| CHDA- bis-IPHA nitrone | " | " | " | 254.37 | 0.0079 | 3.57 |
| CHDA-A | Imine | " | " | 138.21 | 0.0145 | 6.58 |

*Product as supplied

Phenolic Resin Hardeners
  Oxazolidines:

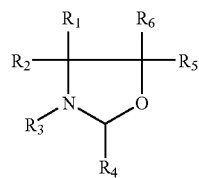

$R_1, R_2, R_3, R_4, R_5, R_6$=may be the same different, selected from H, $C_1$-$C_{12}$ linear or branched alkyl or alkenyl, phenyl, substituted aryl, heterocyclic, hydroxymethyl, hydroxy-terminated polyoxyalkylene

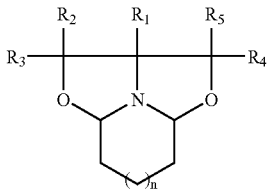

n=integer from 1 to 6

$R_1, R_2, R_3, R_4, R_5$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

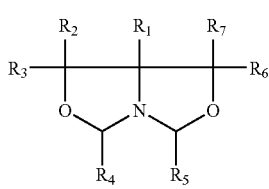

$R_1, R_2, R_3, R_4, R_5, R_7$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

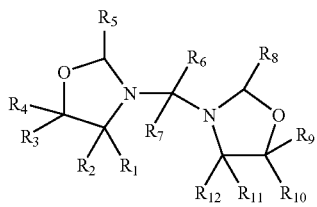

$R_1$ to $R_{12}$=same or different, selected from H, $C_1$-$C_{12}$ linear or branched alkyl or alkenyl, phenyl, substituted aryl, heterocyclic, hydroxymethyl, hydroxy-terminated polyoxyalkylene Nitroalcohols, Nitroacetals:

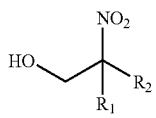

R₁, R₂=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

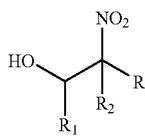

R₁, R₂, R₃=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

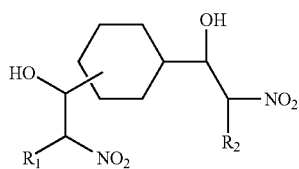

1,2-, 1,3-, and 1,4-isomers

R₁, R₂=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

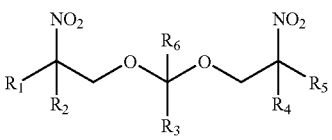

R₁ to R₆=may be the same or different, selected from H, $C_1$-$C_{12}$ linear or branched alkyl or alkenyl, phenyl, substituted aryl, heterocyclic, hydroxymethyl, hydroxy-terminated polyoxyalkylene Aminonitroalcohols:

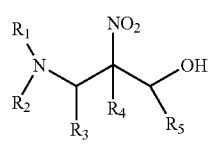

R₁, R₂, R₃, R₄, R₅=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

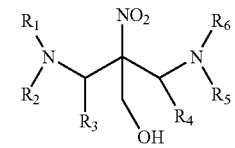

R₁, R₂, R₃, R₄, R₅, R₆=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

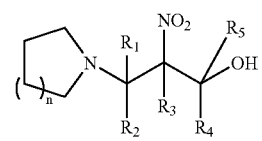

n=integer from 1 to 6

R₁ to R₅=same or different, selected from H, $C_1$-$C_{12}$ linear or branched alkyl or alkenyl, phenyl, substituted aryl, heterocyclic, hydroxy, hydroxy-terminated polyoxyalkylene

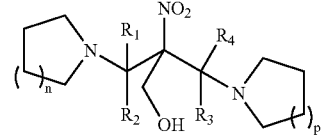

n, p=same or different=integer from 1 to 6

R₁ to R₄=same or different, selected from H, $C_1$-$C_{12}$ linear or branched alkyl or alkenyl, phenyl, substituted aryl, heterocyclic, hydroxymethyl, hydroxy-terminated polyoxyalkylene Nitro-olefins, Hydroxylamines:

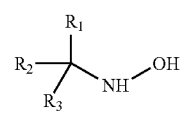

R₁, R₂, R₃=may be the same or different, selected from H, $C_1$-$C_{12}$ linear, cyclic or branched alkyl or alkenyl, phenyl, substituted aryl, heterocyclic, hydroxymethyl, hydroxy-terminated polyoxyalkylene

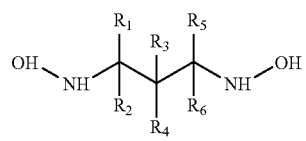

R₁ to R₆=may be the same or different, selected from H, $C_1$-$C_{12}$ linear or branched or cyclic alkyl or alkenyl, phenyl, substituted aryl, heterocyclic, hydroxymethyl, hydroxy-terminated polyoxyalkylene

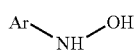

Ar=phenyl or substituted aryl

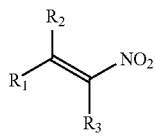

R$_1$, R$_2$, R$_3$=may be the same or different, selected from H, C$_1$-C$_{12}$ linear or branched alkyl or alkenyl, phenyl, substituted aryl, heterocyclic, hydroxymethyl, hydroxy-terminated polyoxyalkylene Nitrones:

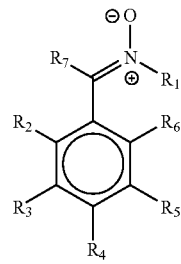

R$_1$=selected from H, C$_1$-C$_{12}$ linear or branched alkyl or alkenyl, phenyl, substituted aryl, heterocyclic R$_2$ to R$_7$=may be the same or different, selected from H, C$_1$-C$_{12}$ linear or branched alkyl or alkenyl, phenyl, substituted aryl, heterocyclic, hydroxymethyl, hydroxy, C$_1$-C$_{12}$ linear or branched alkyl or alkenyl oxy, phenoxy, substituted aryloxy, Cl, Br, F, trifluoromethyl, thio, C$_1$-C$_{12}$ linear or branched alkyl or alkenyl thio, C$_1$-C$_{12}$ linear or branched dialkylamino, diarylamino

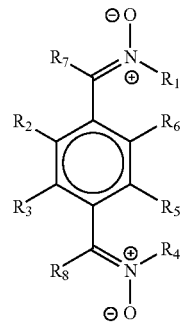

1,2-, 1,3-, and 1,4-isomers

R$_1$, R$_4$=may be the same or different, selected from H, C$_1$-C$_{12}$ linear or branched alkyl or alkenyl, phenyl, substituted aryl, heterocyclic R$_2$ to R$_8$=may be the same or different, selected from H, C$_1$-C$_{12}$ linear or branched alkyl or alkenyl, phenyl, substituted aryl, heterocyclic, hydroxymethyl, hydroxy, C$_1$-C$_{12}$ linear or branched alkyl or alkenyl oxy, phenoxy, substituted aryloxy, Cl, Br, F, trifluoromethyl, thio, C$_1$-C$_{12}$ linear or branched alkyl or alkenyl thio, C$_1$-C$_{12}$ linear or branched dialkylamino, diarylamino Nitrones:

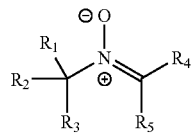

R$_1$ to R$_5$=may be the same or different, selected from H, C$_1$-C$_{12}$ linear or branched alkyl or alkenyl, phenyl, substituted aryl, heterocyclic

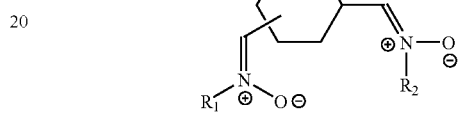

1,2-, 1,3-, and 1,4-isomers

R$_1$, R$_2$=may be the same or different, selected from H, C$_1$-C$_{12}$ alkyl or alkenyl, phenyl, substituted aryl, heterocyclic Various Functionalities:

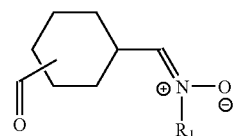

1,2-, 1,3-, and 1,4-isomers

R$_1$=H, C$_1$-C$_{12}$ linear or branched alkyl or alkenyl, phenyl, substituted aryl, heterocyclic

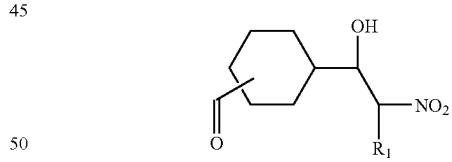

1,2-, 1,3-, and 1,4-isomers

R$_1$=H, C$_1$-C$_{12}$ linear or branched alkyl or alkenyl, phenyl, substituted aryl, heterocyclic, hydroxymethyl Various Functionalities:

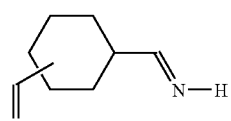 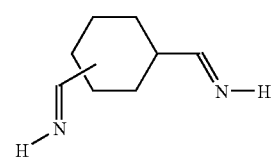

1,2-, 1,3-, and 1,4-isomers

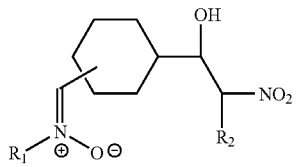

1,2-, 1,3-, and 1,4-isomers $R_1$=H, $C_1$-$C_{12}$ linear or branched alkyl or alkenyl, phenyl, substituted aryl, heterocyclic $R_2$=H, $C_1$-$C_{12}$ linear or branched alkyl or alkenyl, phenyl, substituted aryl, heterocyclic, hydroxymethyl 1,2-, 1,3-, and 1,4-isomers

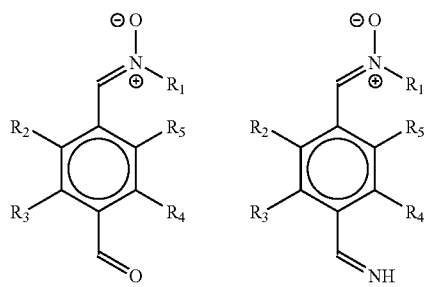

1,2-, 1,3-, and 1,4-isomers $R_1$=H, $C_1$-$C_{12}$ linear or branched alkyl or alkenyl, phenyl, substituted aryl, heterocyclic $R_2$, $R_3$, $R_4$, $R_5$=may be the same or different, selected from H, $C_1$-$C_{12}$ linear or branched alkyl or alkenyl, phenyl, substituted aryl, heterocyclic, hydroxymethyl, hydroxyl, linear or branched alkyl or alkenyl oxy, phenoxy, substituted aryloxy, Cl, Br, F, trifluoromethyl, thio, linear or branched alkyl or alkenyl thio, $C_1$-$C_{12}$ linear or branched dialkylamino, diarylamino Hexahydropyrimidines (PYRIM):

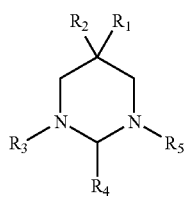

$R_1$=may be $NO_2$, H, $C_1$-$C_{12}$ linear or branched alkyl or alkenyl, phenyl, substituted aryl, heterocyclic, hydroxymethal, hydroxy, $C_1$-$C_{12}$ linear or branched alkyl or alkenyl oxy, phenoxy, substituted aryloxy, hydroxy-terminated polyoxyalkylene $R_2$ to $R_5$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene Nitroamines (NAm):

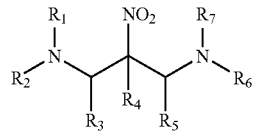

$R_1$ to $R_7$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene Hydroxylamines (HA):

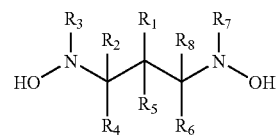

$R_1$ to $R_8$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

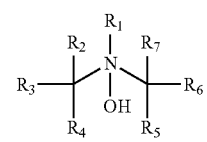

$R_1$ to $R_7$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

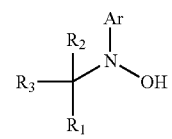

Ar=phenyl or substituted aryl $R_1$ to $R_3$=may be the same or different, selected from H, $C_1$-$C_{12}$ linear or branched alkyl or alkenyl, phenyl, substituted aryl, heterocyclic, hydroxymethyl, hydroxy-terminated polyoxyalkylene

What is claimed is:

1. A curable phenolic resin comprising:
   a. a novolac resin prepared from a phenolic compound and an aldehyde, wherein the phenolic compound is selected from the group consisting of phenol, resorcinol, bisphenol, phloroglucinol, cresols, alkyl phenols, phenol ethers, tannins and lignins, wherein the ratio of aldehyde to phenolic compound is less than 1; and
   b. a curing agent selected from the group consisting of oxazolidines, nitroamines, aminonitroalcohols, imines, hexahydropyrimidines, nitroalcohols, nitrones, hydroxylamines, nitro-olefins and nitroacetals, wherein the curable phenolic resin is used in molding compounds, foundry materials, abrasives, friction materials, insulation, adhesives, coatings, prepregs, electronics, laminates, filament winding, pultrusion, composites, and fire resistant and flame-retardant end uses.

2. The curable phenolic resin of claim 1, wherein the aldehyde is selected from the group consisting of formaldehyde, acetaldehyde, propionaldehyde, cyclohexanedicarboxaldehydes, benzaldehydes, furfural, an aryl aldehyde and a heterocyclic aldehyde.

3. The curable phenolic resin of claim 1 wherein the curing agent is a nitroaminoalcohol having the following structures:

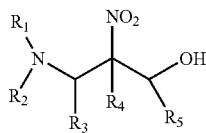 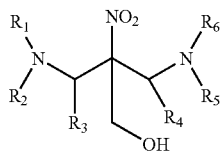

wherein $R_1$ to $R_6$ may be the same or different, selected from H, $C_1$-$C_{12}$ linear or branched alkyl or alkenyl, phenyl, substituted aryl, heterocyclic, hydroxymethyl, hydroxy-terminated polyoxyalkylene.

4. The curable phenolic resin of claim 3 wherein the nitroaminoalcohol is selected from the group consisting of DEA/NMPD and DMA/NMPD.

5. The curable phenolic resin of claim 1 wherein the curing agent is a nitroaminoalcohol having the following structures:

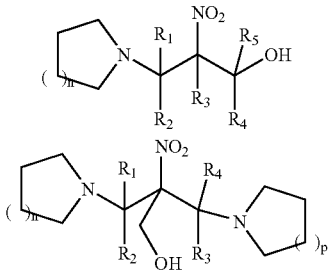

wherein n and p are integers from 1 to 6, and $R_1$ to $R_5$ are the same of different, selected from H, $C_1$-$C_{12}$ linear or branched alkyl or alkenyl, phenyl, substituted aryl, heterocyclic, hydroxymethyl, hydroxy-terminated polyoxyalkylene.

6. The curable phenolic resin of claim 5 wherein the nitroaminoalcohol comprises PYRR/NMPD.

7. The curable phenolic resin of claim 1 wherein the curing agent is a nitroamine having the following structure:

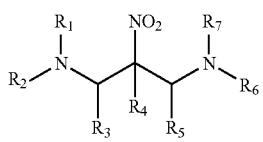

wherein $R_1$ to $R_7$ are the same or different, selected from H, $C_1$-$C_{12}$ linear or branched alkyl or alkenyl, phenyl, substituted aryl, heterocyclic, hydroxymethyl, hydroxy-terminated polyoxyalkylene.

8. The curable phenolic resin of claim 7 wherein the nitroamine is selected from the group consisting of NMPD-bis-DMA and NMPD-bis-DEA.

9. The curable phenolic resin claim 1, wherein the curing agent comprises an oxazolidine selected from the group consisting of ZT-55, CS-1135, CS-1991 and CS-1246.

10. The curable phenolic resin claim 1, wherein the curing agent comprises a combination of CS-135 oxazolidine and DMA/NMPD.

11. The curable phenolic resin of claim 1, wherein the curing agent comprises the nitroalcohol, TN.

12. The curable phenolic resin of claim 1, wherein the curing agent comprises vanillin-IPHA nitrone.

13. The curable phenolic resin of claim 9, wherein the oxazolidine is combined with a nitroaminoalcohol selected from the group consisting of DEA/NMPD, DMA/NMPD and PYRR/NMPD.

14. The curable phenolic resin of claim 11, wherein the nitroalcohol is combined with DEA/NMPD.

15. The curable phenolic resin of claim 1, wherein the curing agent comprises a combination of a nitroaminoalcohol and a hydroxylamine.

16. The curable phenolic resin of claim 15, wherein the curing agent comprises a combination of a nitroalcohol, a nitroaminoalcohol and a hydroxylamine.

17. The curable phenolic resin of claim 11, wherein the nitroalcohol is combined with CHDA-A.

18. The curable phenolic resin of claim 11, wherein the nitroalcohol is combined with a nitroamine.

19. The curable phenolic resin of claim 1, wherein the curing agent comprises NMPD-bis-DEA.

20. The curable phenolic resin of claim 1, wherein the curing agent comprises a hexahydropyrimidine.

21. The curable phenolic resin of claim 1, wherein the curing agent comprises a combination of a hydroxylamine and a hexahydropyrimidine.

22. The curable phenolic resin of claim 1, wherein the curing agent comprises a combination of a nitroalcohol, a hexahydropyrimidine and a hydroxylamine.

23. The curable phenolic resin of claim 1, wherein the curing agent comprises a hydroxylamine-formaldehyde nitrone selected from the group consisting of N-CyhexHA, N-BzHA, EHA, PHA, IPHA and tBuHA.

24. The curable phenolic resin of claim 1, wherein the curing agent comprises a combination of a nitroalcohol, an oxazolidine, and a hydroxylamine.

25. The curable phenolic resin of claim 1, wherein the curing agent comprises a combination of a nitroaminoalcohol and a hydroxylamine.

26. The curable phenolic resin of claim 1, wherein the curing agent comprises a combination of hexamethylenetetramine and a hydroxylamine.

27. The curable phenolic resin of claim 1, wherein the curing agent comprises a combination of hexamethylenetetramine and a nitroamine.

28. The curable phenolic resin of claim 1, which is used in prepreg end uses.

* * * * *